US007171182B2

United States Patent
Filipovic

(10) Patent No.: US 7,171,182 B2
(45) Date of Patent: Jan. 30, 2007

(54) FREQUENCY SYNTHESIZERS FOR SUPPORTING VOICE COMMUNICATION AND WIRELESS NETWORKING STANDARDS

(75) Inventor: Daniel F. Filipovic, Solana Beach, CA (US)

(73) Assignee: Qualcomm Incorporated, San Diego, CA (US)

( * ) Notice: Subject to any disclaimer, the term of this patent is extended or adjusted under 35 U.S.C. 154(b) by 303 days.

(21) Appl. No.: 10/137,101

(22) Filed: May 1, 2002

(65) Prior Publication Data

US 2004/0198256 A1    Oct. 7, 2004

(51) Int. Cl.
*H04B 1/06* (2006.01)

(52) U.S. Cl. ............... 455/258; 455/255; 455/180.03; 455/183.1; 455/188.1; 375/376; 375/327; 331/34

(58) Field of Classification Search ............... 455/102, 455/76, 71, 550.1, 214, 552.1, 575.1, 147, 455/216, 258, 260, 118, 63.1, 264, 168.1, 455/180.1, 208, 318, 180.2, 180.3, 265, 323, 455/182.1, 182.3, 266, 183.1, 186.1, 255, 455/553.1, 188.1, 188.2, 190.1, 316, 259, 455/561, 424, 425, 456.5, 456.6, 313, 189.1, 455/165.1, 314, 257, 182.2; 331/25, 1 R, 331/2, 74, 37, 14, 16, 46, 49, 51, 18, 68, 331/69, 34, 53, 177 R, 179; 330/52, 151; 329/50, 103, 122, 123, 124, 125; 332/127; 375/316, 376, 327, 345, 344, 347, 362, 219, 375/215; 370/493–495

See application file for complete search history.

(56) References Cited

U.S. PATENT DOCUMENTS

| | | | | |
|---|---|---|---|---|
| 4,131,861 A | * | 12/1978 | Malaviya | 331/2 |
| 5,790,587 A | | 8/1998 | Smith et al. | 375/200 |
| 5,801,589 A | * | 9/1998 | Tajima et al. | 331/1 R |
| 5,887,020 A | * | 3/1999 | Smith et al. | 375/130 |
| 5,983,081 A | * | 11/1999 | Lehtinen | 455/76 |

(Continued)

FOREIGN PATENT DOCUMENTS

DE         19819213        4/1998

(Continued)

OTHER PUBLICATIONS

Heinen S et al, "SA 18.4: A 2.7V 2.5GHZ Biopolar Chipset for Digital Wireless Communication", IEEE International Solid State Circuits Conference, vol. 40, Feb. 1, 1997, pp. 306-307.

*Primary Examiner*—Edward F. Urban
*Assistant Examiner*—Charles Chow
(74) *Attorney, Agent, or Firm*—Philip Wadsworth; Charles D. Brown; Howard H. Seo

(57) ABSTRACT

Techniques are described that facilitate the generation of different waveforms at different frequencies required for transmission and reception of wireless voice signals and wireless data signals. For example, a technique may include generating a first waveform in a wireless communication device using a frequency synthesizer, wherein the first waveform has a frequency associated with a voice communication standard, and generating a second waveform in the wireless communication device using the same frequency synthesizer, wherein the second waveform has a frequency associated with a wireless networking standard. In this manner, a wireless communication device can be improved and possibly simplified.

26 Claims, 12 Drawing Sheets

U.S. PATENT DOCUMENTS

| | | | |
|---|---|---|---|
| 6,659,947 B1* | 12/2003 | Carter et al. | 600/300 |
| 6,711,122 B1* | 3/2004 | Langley et al. | 370/205 |
| 2001/0034223 A1* | 10/2001 | Rieser et al. | 455/404 |
| 2002/0006171 A1* | 1/2002 | Nielsen | 375/316 |
| 2002/0039886 A1* | 4/2002 | Doi | 455/25 |
| 2002/0163391 A1* | 11/2002 | Peterzell | 331/25 |
| 2003/0058042 A1* | 3/2003 | Ishida et al. | 330/52 |
| 2003/0171101 A1* | 9/2003 | Suzuki et al. | 455/147 |
| 2004/0041642 A1* | 3/2004 | Hahn et al. | 331/74 |
| 2004/0198256 A1* | 10/2004 | Filipovic | 455/102 |

FOREIGN PATENT DOCUMENTS

| | | |
|---|---|---|
| EP | 0945990 | 9/1999 |

* cited by examiner

FREQUENCY SYNTHESIZERS FOR SUPPORTING VOICE COMMUNICATION AND WIRELESS NETWORKING STANDARDS

FIELD

This disclosure relates to wireless communication and, more particularly, to wireless communication devices that support voice communication standards and wireless networking standards.

BACKGROUND

Wireless networks allow computing devices to share information and resources via wireless communications. Examples of computing devices used in wireless networks include laptop or desktop computers, personal digital assistants (PDAs), mobile phones such as cellular radiotelephones and satellite radiotelephones, data terminals, data collection devices, personal digital assistants (PDAs) and other portable and non-portable computing devices. One broad family of standards developed to facilitate wireless networking is set forth in the IEEE 802.11 standard. The original IEEE 802.11 standard provides data transfer rates of 1–2 Megabits per second (Mbps) in a 2.4–2.483 Gigahertz (GHz) frequency band (hereafter the 2.4 GHz band). However, a number of extensions to the original IEEE 802.11 standard have been developed in an effort to increase data transfer rates.

The IEEE 802.11b standard (sometimes referred to as 802.11 wireless fidelity or 802.11 Wi-Fi) is an extension of the IEEE 802.11 standard that provides 11 Mbps transmission (with a fallback to 5.5, 2.0 and 1.0 Mbps) in the 2.4 GHz band. The IEEE 802.11b standard utilizes binary phase shift keying (BPSK) for 1.0 MBPS transmission, and quadrature phase shift keying (QPSK) for 2.0, 5.5 and 11.0 Mbps transmission. Complimentary code keying (CCK) techniques are also employed by the IEEE 802.11b standard in order to achieve multi-channel operation in the 2.4 GHz band for the 5.0 and 11.0 Mbps transmission rates.

The IEEE 802.11g standard is another extension of the IEEE 802.11 standard. The IEEE 802.11g standard utilizes orthogonal frequency division multiplexing (OFDM) in the 2.4 GHz frequency band to provide data transmission at rates up to 54 Mbps. The IEEE 802.11g standard also provided backwards capability with 802.11b networks. The IEEE 802.11a standard is an extension of IEEE 802.11 standard that utilizes OFDM in a 5 GHz frequency band to provide data transmission at rates up to 54 Mbps. These and other wireless networks have been developed. Additional extensions to the IEEE 802.11 standard, as well as other WLAN standards will likely emerge in the future.

Wireless networks may contain one or more access points that interface with wireless and/or wired networks. Access points may also interface wirelessly with other access points to extend the geographical size of the wireless network. In addition, wireless routers may be used in wireless networks to perform data routing functions within the wireless setting and possibly extend the size of the wireless network. Sometimes, both wireless routers and access points are used together to form a relatively large wireless network environment.

Wireless communication devices that support wireless networking standards may also support other communication standards, such as standards commonly used for voice communications. The voice communication standards may be based on one or more of a variety of modulation techniques, such as frequency division multiple access (FDMA), time division multiple access (TDMA), and various spread spectrum techniques. One common spread spectrum technique used in wireless voice communication is code division multiple access (CDMA) signal modulation. In CDMA, multiple communications are simultaneously transmitted over a spread spectrum radio frequency (RF) signal. Other wireless communication systems may use different modulation techniques. For example, GSM systems use a combination of TDMA and FDMA modulation techniques. These techniques are also used in other systems related to GSM systems, including the DCS1800 and PCS1900 systems, which operate at 1.8 GHz and 1.9 GHz, respectively.

Frequency synthesizers are commonly implemented within wireless communication devices to facilitate RF signal reception and RF signal transmission. For example, during RF signal reception, RF signals are typically mixed down to baseband signals, which can be converted to digital values and demodulated. Reference waveforms are produced by a frequency synthesizer and mixed with an RF waveform to generate the baseband signals. The process of mixing an RF waveform down to baseband is sometimes referred to as a down-conversion process.

Frequency synthesizers are also used during RF signal transmission. In that case, baseband signals are up-mixed to RF (sometimes referred to as an up-conversion process). During the up-conversion process, the frequency synthesizer produces reference waveforms which are modulated with the baseband signal before being wirelessly transmitted. For example, the reference waveform may be created by a voltage controlled oscillator (VCO) having a frequency that is determined by a phase locked loop (PLL). The timing reference for the PLL may be high precision low frequency crystal oscillator, such as a voltage controlled temperature compensated crystal oscillator (VCTCXO).

RF waveforms associated with voice communication standards typically have a different frequency than RF waveforms associated with wireless networking standards such as IEEE 802.11 standards. For example, as mentioned above, many IEEE 802.11 standards operate in the 2.4 GHz band. Voice communication standards, on the other hand typically operate in frequency bands different than the 2.4 GHz band, such as a 800 MHz band, a 1800 MHz band, or a 1900 MHz band. For this reason, conventional wireless communication devices that support both voice communication standards and wireless networking standards typically utilize different frequency synthesizers to generate waveforms at the frequencies required by the different standards.

SUMMARY

This disclosure is directed to various techniques that can be implemented in a wireless communication device that supports both voice communication standards and wireless networking standards. In particular, the techniques may facilitate the generation of different waveforms at different frequencies required for transmission and reception of wireless voice signals and wireless data signals. For example, a technique may include generating a first waveform in a wireless communication device using a frequency synthesizer, wherein the first waveform has a frequency associated with a voice communication standard, and generating a second waveform in the wireless communication device using the same frequency synthesizer, wherein the second waveform has a frequency associated with a wireless networking standard. In this manner, a wireless communication device that supports both voice communication standards and wireless networking standards can be improved and possibly simplified.

Additional details of various embodiments are set forth in the accompanying drawings and the description below. Other features, objects and advantages will become apparent from the description and drawings, and from the claims.

DETAILED DESCRIPTION

Figure 1:
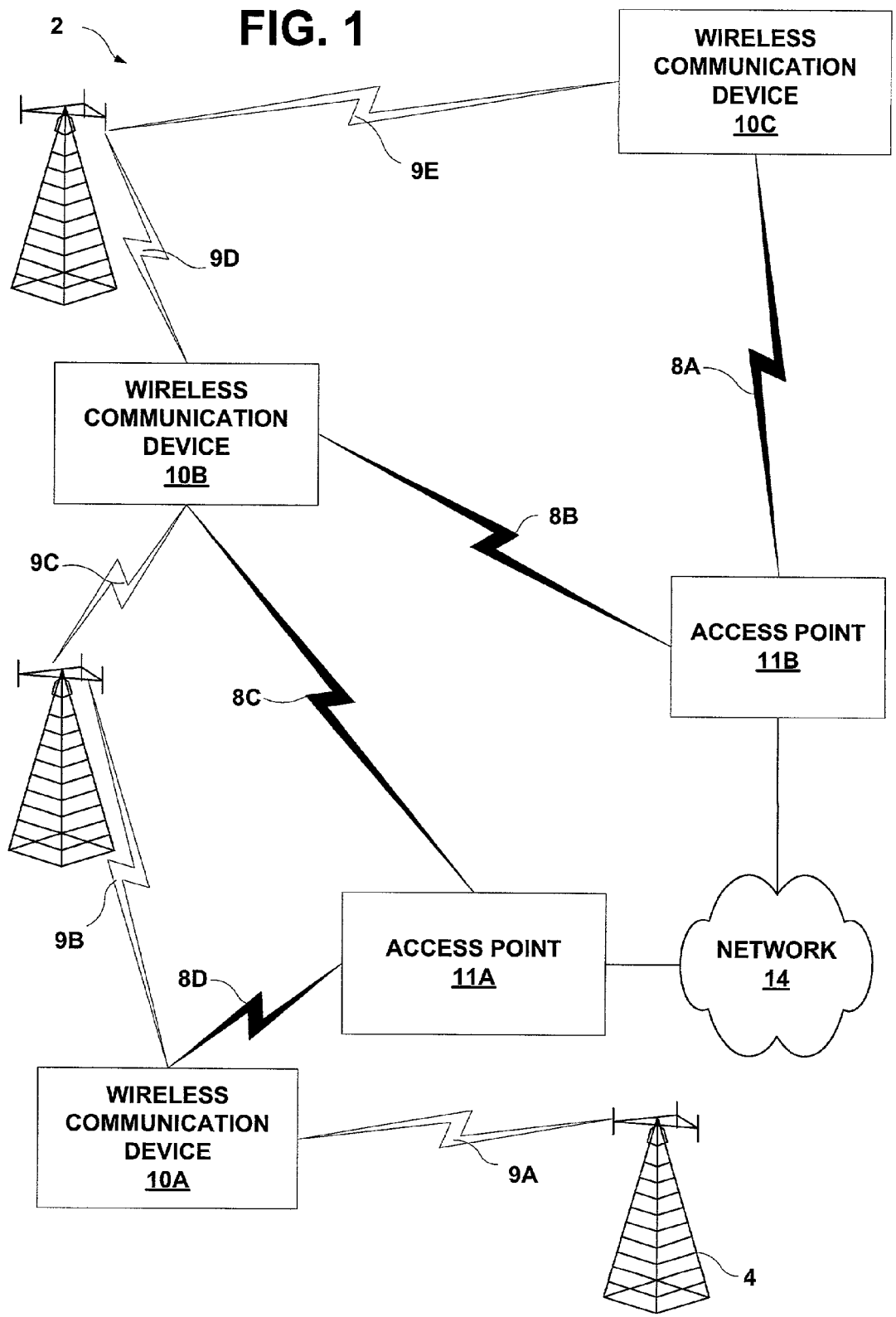
FIG. 1 is a block diagram illustrating a wireless communication system in which wireless communication devices (WCDs) can implement one or more of the techniques described herein.

In general, this disclosure describes a wireless communication device (WCD) configured to perform various signal processing tasks associated with both wireless data communication and wireless voice communication. In this disclosure, the phrase wireless data communication refers to wireless communication according to a wireless networking standard such as one of the IEEE 802.11 standards, a standard according to the Bluetooth Special Interest Group, or the like. The phrase wireless voice communication refers to wireless communication according to a voice communication standard commonly used by radiotelephones, including standards such as GSM, PCS, or the like, that implement modulation techniques such as TDMA, FDMA, CDMA, or combinations thereof.

WCDs that support both voice communication standards and wireless networking standards can be simplified by using all or some of the same components for the processing of RF signals received according to a wireless networking standard and the processing of RF signals received according to a wireless networking standard. Transmission of RF signals may also be simplified in an analogous manner. For example, as outlined in greater detail below, a wireless communication device may include a frequency synthesizer that can generate first waveforms for use in transmission or reception of RF signals according to a voice communication standard, and second waveforms for use in transmission or reception of RF signals according to a wireless networking standard.

The frequency synthesizer may provide different waveforms to separate receivers or transmitters, or may be an integrated part of a integrated receiver or transmitter that supports reception or transmission of RF signals according to both voice and data standards. In any case, a WCD can be simplified, possibly requiring fewer components. For example, the frequency synthesizer may implement a single voltage controlled oscillator (VCO) and a single phase locked loop (PLL). Dividers and/or multipliers that may be implemented to generate waveforms at different frequencies required by the different standards.

By way of example, the frequency synthesizer may generate waveforms in an 800 MHz band (869–894 MHz) or a 1900 MHz band (1930–1990 MHz) for use in receiving or transmitting RF waveforms according to a wireless voice communication standards, and waveforms in an 2.4 GHz band (2412–2483 MHz) for use in receiving or transmitting RF waveforms according to a wireless networking standard. The same principles may also be applied to generate waveforms in other frequency bands, such as a 5 GHZ band for supporting the IEEE 802.11a standard or an 1800 MHz band for supporting other voice communication standards.

The frequency synthesizer may implement a single voltage controlled oscillator that generates a first signal at a first frequency. The voltage controlled oscillator may be tuned by the phase locked loop in order to select the appropriate frequency for the first signal. The voltage controlled oscillator may be coupled to frequency manipulation circuitry that implements dividers and/or multipliers in order to generate different signals at different frequencies. In one example, the first signal is divided to generate a second signal. In that case, the second signal can be multiplied by the first signal to generate a third signal. The second signal may comprise a waveform used for RF signal reception or transmission according to a voice communication standard and the third signal may comprise a waveform used for RF signal reception or transmission according to a wireless networking standard. As mentioned, the voltage controlled oscillator may be tuned accordingly, depending on which waveform is needed. The required tunable range of the voltage controlled oscillator can be reduced because of the implementation of the frequency manipulation circuitry.

In another example, the first signal generated by a voltage controlled oscillator is multiplied by a second signal to generate a third signal, and the third signal is divided by a division factor to generate the second signal which is fed back to the multiplier. In that case, the second signal may comprise a waveform used for RF signal reception or transmission according to a wireless networking standard.

Additional techniques are also described which can simplify the architecture of a WCD when both wireless voice communication standards and wireless networking standards are supported. For example, upon mixing baseband signals from a received RF waveform, the baseband signals may need to be sent from a receiver to a modem. By using the same analog transmission lines to transfer baseband signals from the receiver to the modem, regardless of whether the baseband signals are associated with a wireless voice communication standard or a wireless networking standard, the architecture can be simplified. In other words, a voice receiver and a data receiver can be coupled to a modem via common analog transmissions lines. If the voice receiver mixes baseband signals from a received RF waveform, it uses the transmission lines to transmit the baseband signal to an analog to digital converter on the modem. Similarly, if the data receiver mixes baseband signals from a received RF waveform, it uses the same analog transmission lines to transmit the baseband signal to the analog to digital converter on the modem. In this manner, the architecture can be simplified in a WCD that supports both voice communication standards and wireless networking standards.

FIG. 1 is a block diagram illustrating a wireless communication system 2 including a number of wireless communication devices 10A–10C, collectively referred to as wireless communication devices 10. Wireless communication devices (WCDs) 10 may be any portable computing device configured to support wireless networking. Each device may be, for example, a desktop or portable computer operating in a Windows™, Macintosh™, Unix, or Linux environment, a personal digital assistant (PDA) based on the Palm™, Windows CE, or similar operating system environments for small portable devices, or other wireless device such as a mobile radiotelephone, an interactive television, a wireless data terminal, a wireless data collection device, an Internet kiosk, a network-ready appliance for the home environment, a wireless server, and the like.

WCDs 10 transfer data in wireless communication system 2 via wireless data signals 8A–8D (hereafter wireless data signals 8). In particular, WCDs 10 may transfer data according to a wireless protocol such as the protocol defined by a wireless networking standard, e.g., one of the standards in the IEEE 802.11 family of standards. Modulated wireless data signals 8 in the form of data packets may be sent to and from the respective WCDs 10 by wireless access points 11A and 11B (collectively access points 11). Access points 11 may have wired connections to a network 14, such as a local area network, a wide area network, or a global network such as the Internet.

In addition to supporting wireless networking standards, WCDs 10 within system 2 may also be configured to support one or more voice communication standards. For example, one or more base stations 4 may communicate voice signals 9A–9E (collectively voice signals 9) to WCDs 10 via voice communication techniques such as CDMA techniques, FDMA techniques, TDMA techniques, various combined techniques, and the like. For example, one or more of WCDs 10 may be designed to support one or more CDMA standards such as (1) the "TIA/EIA-95-B Mobile Station-Base Station Compatibility Standard for Dual-Mode Wideband Spread Spectrum Cellular System" (the IS-95 standard), (2) the "TIA/EIA-98-C Recommended Minimum Standard for Dual-Mode Wideband Spread Spectrum Cellular Mobile Station" (the IS-98 standard), (3) the standard offered by a consortium named "3rd Generation Partnership Project" (3GPP) and embodied in a set of documents including Document Nos. 3G TS 25.211, 3G TS 25.212, 3G TS 25.213, and 3G TS 25.214 (the W-CDMA standard), (4) the standard offered by a consortium named "3rd Generation Partnership Project 2" (3GPP2) and embodied in a set of documents including "TR-45.5 Physical Layer Standard for cdma2000 Spread Spectrum Systems," the "C.S0005-A Upper Layer (Layer 3) Signaling Standard for cdma2000 Spread Spectrum Systems," and the "C.S0024 CDMA2000 High Rate Packet Data Air Interface Specification" (the CDMA2000 standard), (5) the HDR system documented in TIA/EIA-IS-856, "CDMA2000 High Rate Packet Data Air Interface Specification, and (6) some other standards. In addition, WCDs 10 may be designed to support other standards, such as the GSM standard or related standards, e.g., the DCS1800 and PCS1900 standards. GSM systems employ a combination of FDMA and TDMA modulation techniques. WCDs 10 may also support other FDMA and TDMA standards.

As outlined in greater detail below, one or more WCDs 10 incorporate a simplified architecture to support both wireless networking standards and voice communication standards. In particular, WCDs 10 may utilize the same frequency synthesizer to generate waveforms for transmission and reception of signals according to the wireless networking standard and the voice communication standard. Additionally, WCDs 10 may use other common components during signal processing of signals associated with the wireless networking standard and the voice communication standard. For example, the same analog transmission lines may be used to transfer baseband signals from a receiver to a modem regardless of whether the receiver is a wireless data receiver or a wireless voice receiver. A user of WCD 10 may select the mode of operation, e.g. voice or data, and components of WCD 10 can be configured as outlined in greater detail below so that wireless signals can be transmitted and received in accordance with the selected mode of operation.

Figure 2:
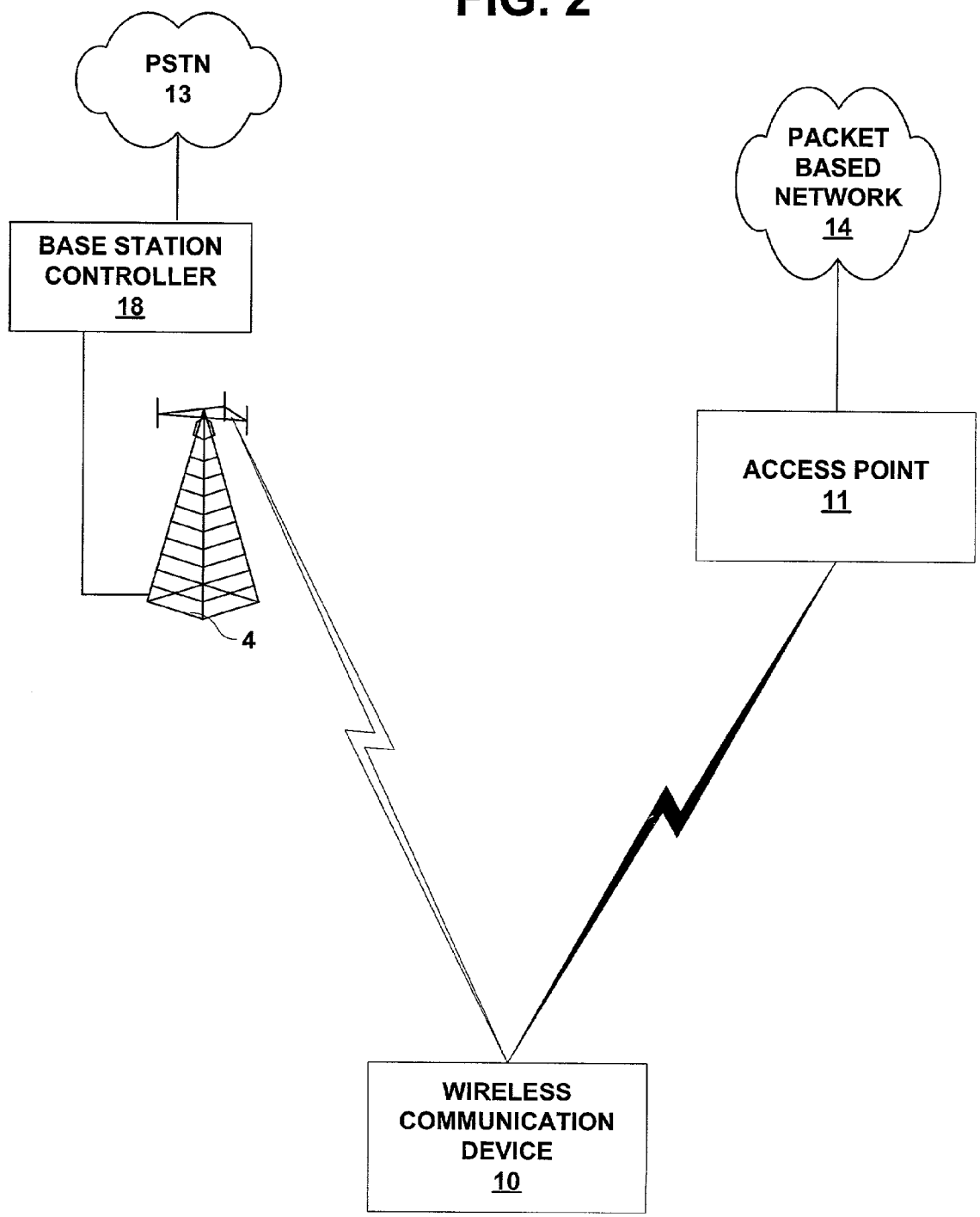
FIG. 2 is a block diagram of a wireless communication system in which a WCD supports a voice communication standard and a wireless networking standard.

FIG. 2 is another block diagram of a wireless communication system in which a WCD 10 supports a voice communication standard and a wireless networking standard. As shown, WCD 10 can transmit and receive wireless data signals 8 according to a wireless networking standard. In particular WCD 10 receives wireless RF signals in which data is modulated according to a modulation scheme used for wireless networking, such as the BPSK or QPSK modulation schemes typically implemented by devices compliant with the IEEE 802.11b wireless networking standard or the OFDM modulation scheme typically implemented by devices compliant with the IEEE 802.11g or IEEE 802.11a wireless networking standards. In any case, data signals 8 take the form of data packets encoded according to the modulation scheme used. Dividing the data into packets has several advantages including enabling the sending device to resend only those individual packets that may be lost or corrupted during transmission. Wireless networks typically operate according to a resend-until-acknowledged protocol in which the packets are resent from access point 11 to WCD 10 until WCD 10 acknowledges receipt of the packet. Access point 11 typically has a wired connection to routers within a packet based network 14, such as a local area network, a wide area network, or a global network such as the Internet.

WCD 10 can also transmit and receive voice signals 9 according to a wireless voice communication standard. In particular WCD 10 may receive wireless RF signals from base station 4 in which data is modulated according to a modulation scheme used for wireless voice communication, such as FDMA, TDMA or CDMA modulation schemes mentioned above. Base station 4 (sometimes referred to as a base transceiver system BTS) is typically connected to a base station controller 18 to provide an interface between the base station 4 and a public switched telephone network (PSTN) 13. Again, WCD 10 implements one or more of the techniques outlined in greater detail below in order to simplify and possibly improve the architecture when wireless voice signals 9 and wireless data signals 8 are supported. In either case, a user of WCD 10 selects the mode of operation, and components of WCD 10 can be configured as outlined in greater detail below.

Figure 3:
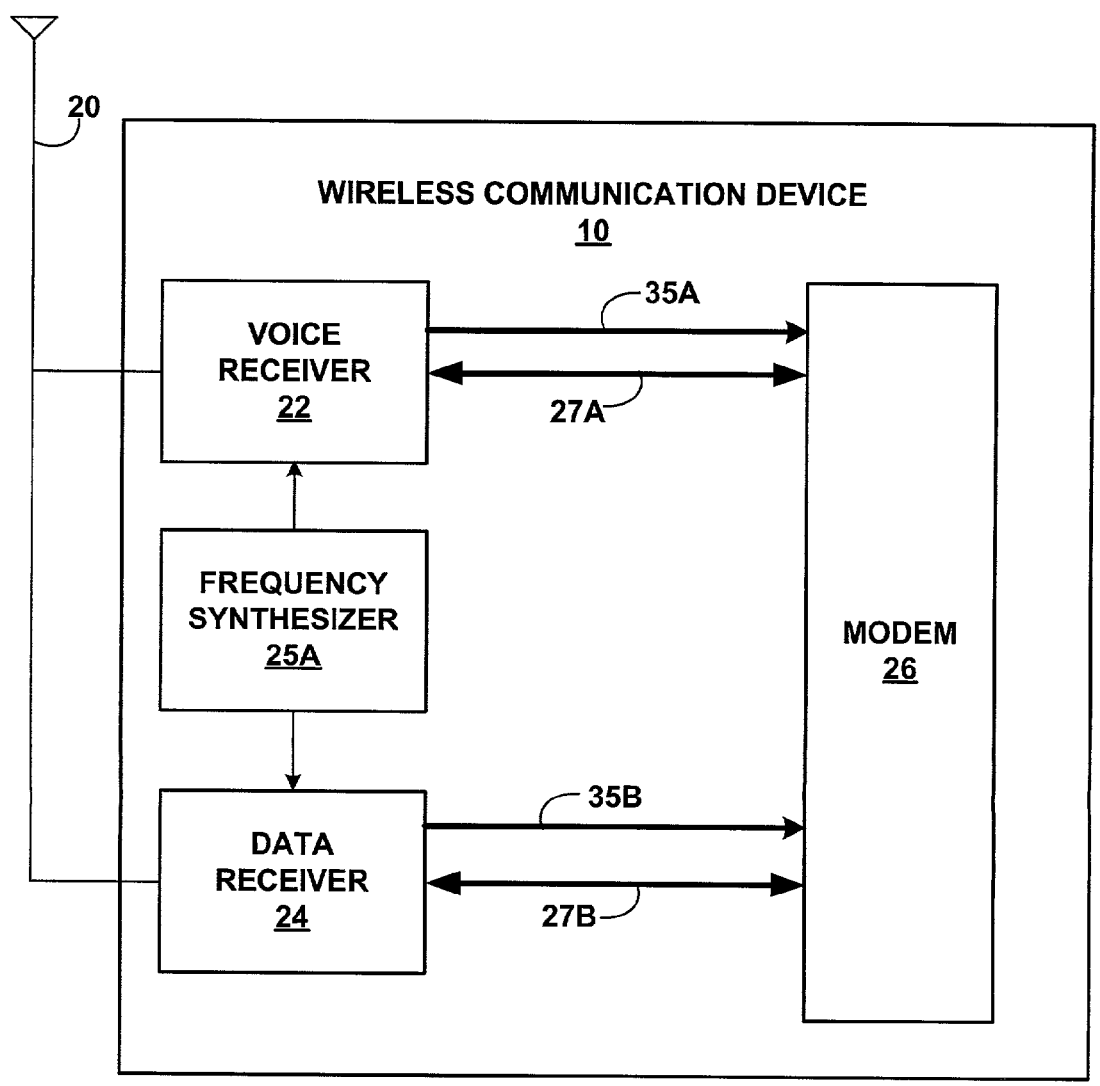
FIG. 3 is a block diagram illustrating a WCD that can receive signals according to a voice communication standard and a wireless networking standard.
Figure 4:
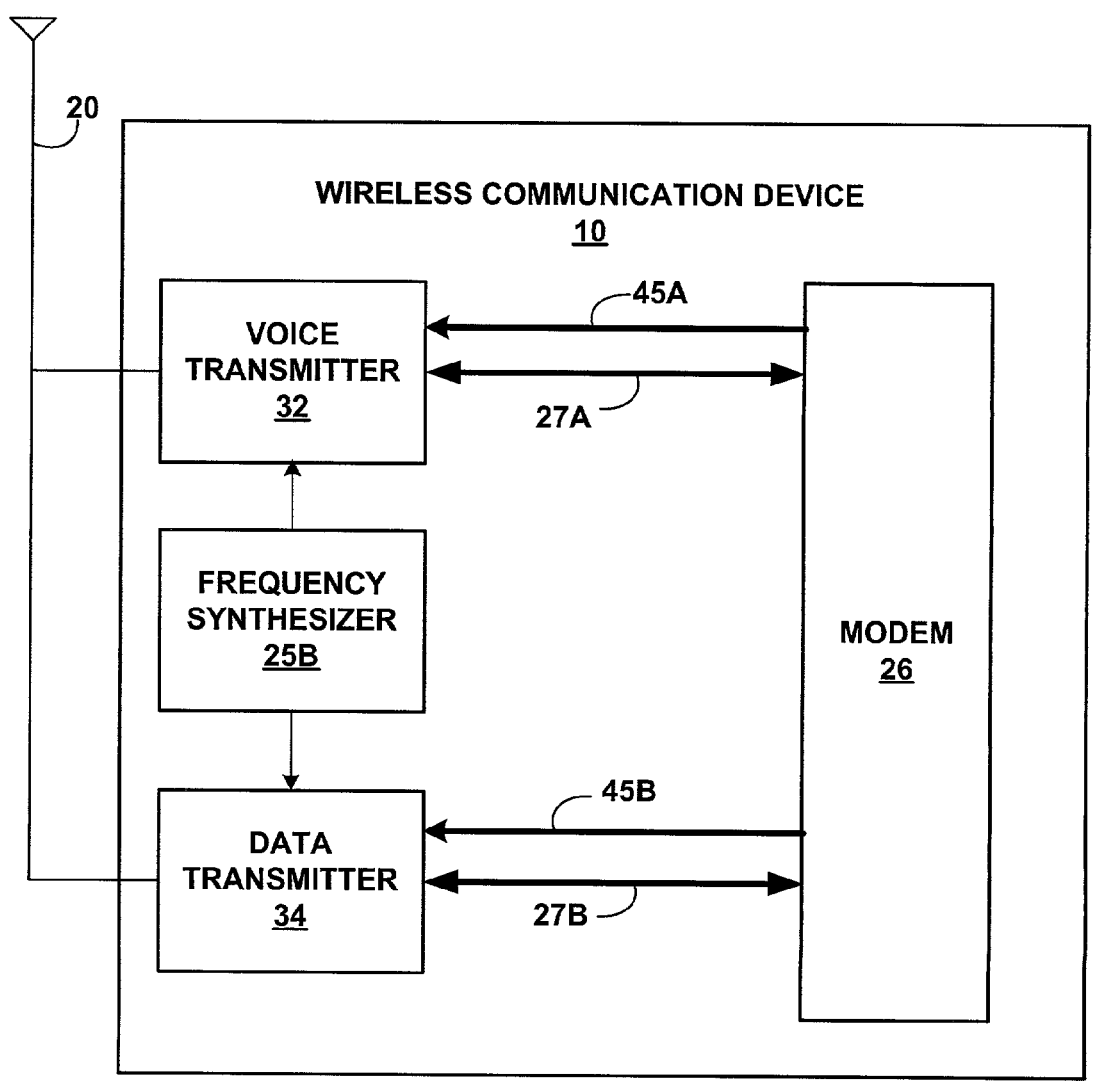
FIG. 4 is a block diagram illustrating a WCD that can transmit signals according to a voice communication standard and a wireless networking standard.

FIGS. 3 and 4 are block diagrams of a wireless communication device 10 implementing frequency synthesizers 25A and 25B during RF signal reception and RF signal transmission respectively. In either case, a frequency synthesizer 25, i.e., frequency synthesizer 25A or 25B, may implement one or more of the techniques outlined below to improve operation of the wireless communication device 10.

In particular, wireless communication device (WCD) 10 may implement the zero intermediate frequency (zero IF) architecture, although this disclosure is not limited in that respect. In that case, WCD 10 converts incoming RF signals directly into baseband signals and, specifically, does not first convert the RF signals to intermediate frequency (IF) signals. It is understood, however, that the techniques described herein may be readily applicable to any architecture that implements one or more frequency synthesizers including architectures that implement an intermediate frequency (IF) section.

As shown in FIG. 3, WCD 10 includes antenna 20 that receives incoming RF signals. For example, the incoming RF signals may comprise voice signals, such code division multiple access (CDMA) modulated signals sent from a CDMA base station, or alternatively data signals, such as packets modulated according to a wireless networking standard in the IEEE 802.11 family of standards. Voice signals received by antenna 20 can be processed by voice receiver 22, whereas data signals received by antenna 20 can be processed by data receiver 24. In particular, the receivers 22, 24 may pass the received signals through a low-noise amplifier (LNA) and one or more filters. The signal is then mixed down to baseband. In particular, each receiver may implement a mixer that receives reference waveforms produced by frequency synthesizer 25A. Frequency synthesizer 25A may generate waveforms at different frequencies for use by the different receivers 22, 24.

Receivers may be coupled to a modulator/demodulator (modem) via analog transmission lines 35A and 35B and possibly a serial bus 27A and 27B. Upon mixing a received RF waveform down to baseband, the baseband signal can be sent to modem 26 over the respective analog transmission line 35A, 35B. Modem 26 may convert the baseband signals to digital values and perform demodulation. In this disclosure, the term modem refers to a component or collection of components that can perform modulation, demodulation, or both modulation and demodulation.

FIG. 4 is another block diagram of WCD 10, illustrating components implemented during RF signal transmission. In that case, WCD 10 may implement different transmitters 32, 34 coupled to modem 26 via analog transmission lines 45A and 45B and possibly a serial bus 47A and 47B. For example, voice transmitter 32 can be used to transmit voice signals modulated according to a voice communication standard, whereas data transmitter 34 can be used to transmit data packets modulated according to a wireless networking standard. The transmitters 32, 34 may receive baseband signals from modem 26 and up-mix the baseband signals to RF using waveforms produced by a common frequency synthesizer 25B. Again, frequency synthesizer 25B may generate waveforms at different frequencies for use by both of the different transmitters 32, 34.

Figure 5:
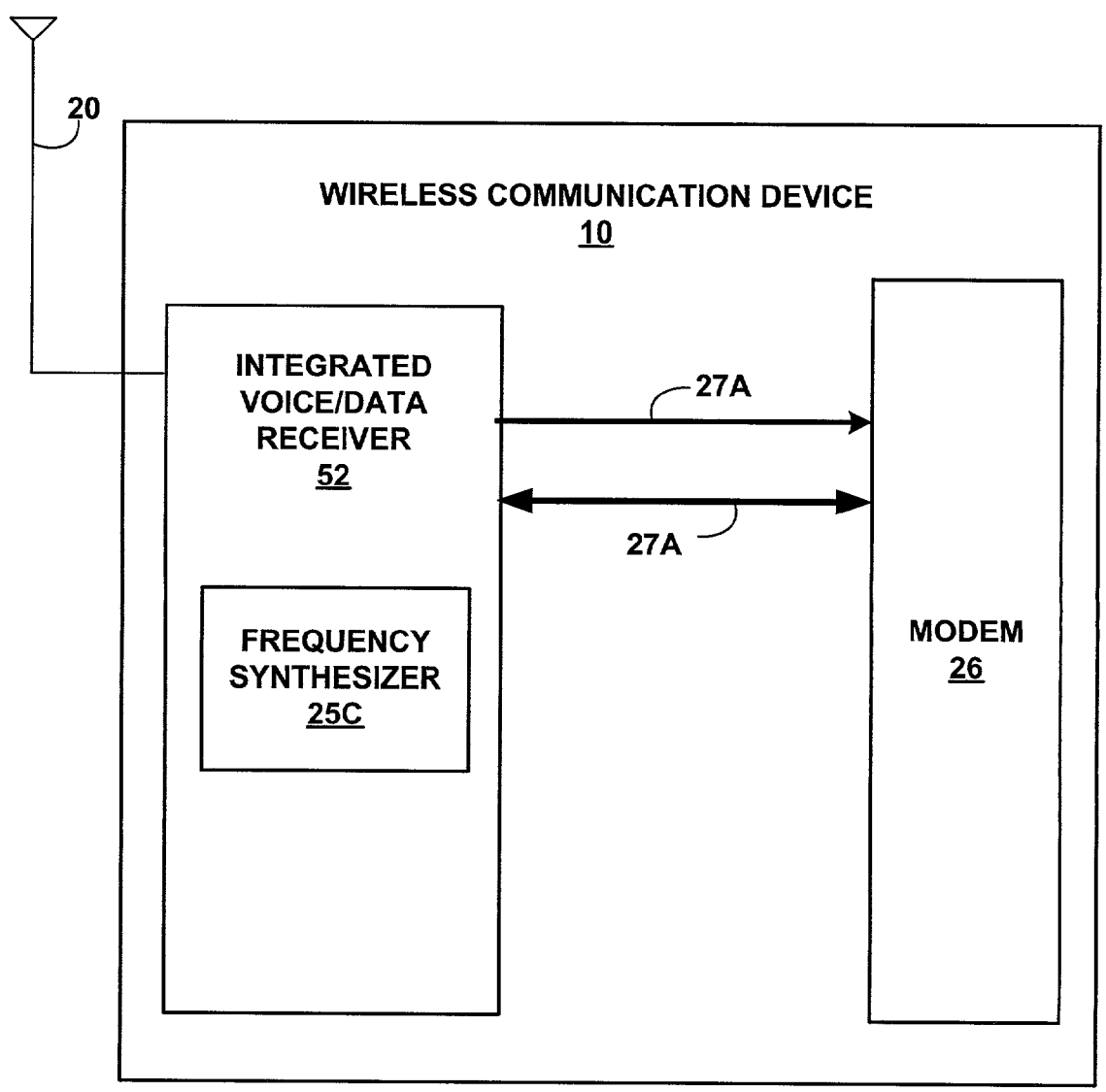
FIG. 5 is a block diagram illustrating a WCD that incorporates an integrated voice/data receiver that can receive signals according to a voice communication standard and a wireless networking standard.

FIG. 5 is a block diagram illustrating a WCD 10 that incorporates an integrated voice/data receiver that can receive signals according to a voice communication standard and a wireless networking standard. In that case, receiver 52 differentiates received signals as being wireless voice signals or data signals modulated according to a wireless networking standard. Frequency synthesizer 25C may generate waveforms at different frequencies for use by receiver 52. In particular, frequency synthesizer 25C can generate waveforms at a first frequency when a received signal is a voice signal modulated according to a voice communication standard, and also generate waveforms at a second frequency when a received signal is a data signal modulated according to a wireless networking standard. Receiver 52 may be coupled to modem 26 via analog transmission lines 55A and 55B and possibly a serial bus 57A and 57B.

In still other implementations, a WCD may incorporate an integrated voice/data transmitter that can transmit signals according to a voice communication standard and a wireless networking standard. In that case, a frequency synthesizer may generate waveforms at different frequencies for use by the transmitter based on whether a transmitted signal is voice signal or a data signal. In some cases, antenna 20 (FIGS. 3–5) may be coupled to a duplexer (not shown), which is in turn coupled to both a receiver and a transmitter. In other words, the duplexer may differentiate the incoming and outgoing signal paths. For simplicity, however, the duplexer is not illustrated. In any case, WCD 10 incorporates a frequency synthesizer that generates first and second waveforms at first and second frequencies respectively. Thus, the same frequency synthesizer can be used to generate waveforms for data communication according to a wireless networking standard and voice communication according to a voice communication standard. As a result, improvements such as reduced complexity, fewer components and reduced power consumption can be achieved in a WCD that supports voice and data standards.

The frequency synthesizer 25 may be coupled to two separate receivers as illustrated in FIG. 3, coupled to two separate transmitters as illustrated in FIG. 4, integrated as part of an integrated voice/data receiver as illustrated in FIG. 5, integrated as part of an integrated voice/data transmitter, coupled to transmitters and receivers, or coupled to an integrated transceiver that performs transmission and reception of voice and data signals. In any case, WCD 10 can be simplified because separate frequency synthesizers are not needed in order to generate the different waveforms needed to support both voice communication standards and wireless networking standards.

Figure 6:
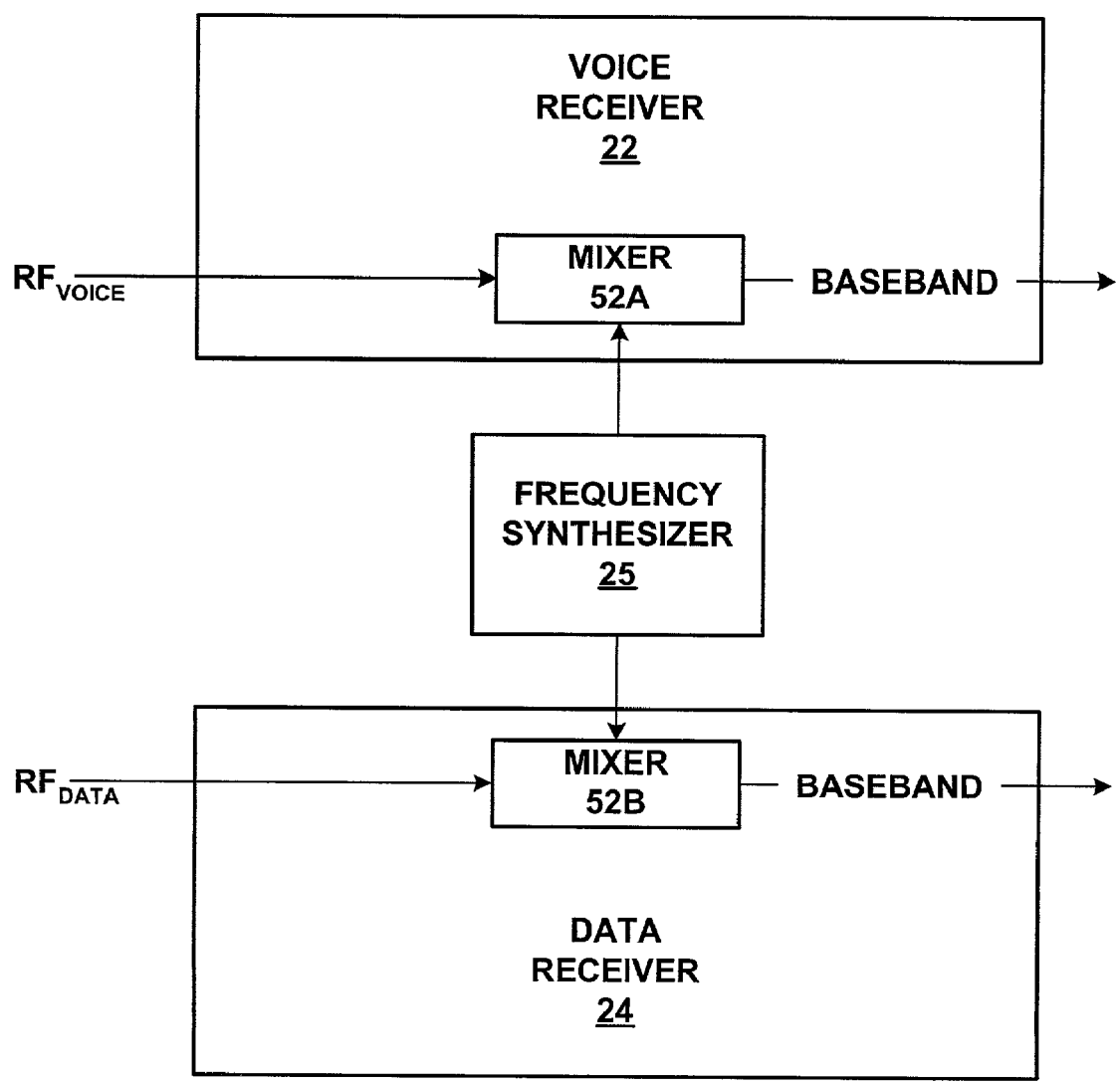
FIG. 6 is a block diagram of a frequency synthesizer providing waveforms to a voice receiver that receives signals according to a voice communication standard and a data receiver that receives signals according to a wireless networking standard.

FIG. 6 is a block diagram of a frequency synthesizer 25A providing waveforms to a voice receiver 22 that receives signals according to a voice communication standard and a data receiver 24 that receives signals according to a wireless networking standard. As illustrated, voice receiver 22 may implement mixer 52A to down-convert $RF_{VOICE}$ signals to baseband. Similarly, data receiver 22 may implement mixer 52B to down-convert $RF_{DATA}$ signals to baseband. Similar components may be implemented by transmitters to up-convert baseband signals to $RF_{VOICE}$ and $RF_{DATA}$ signals respectively.

Figure 7:
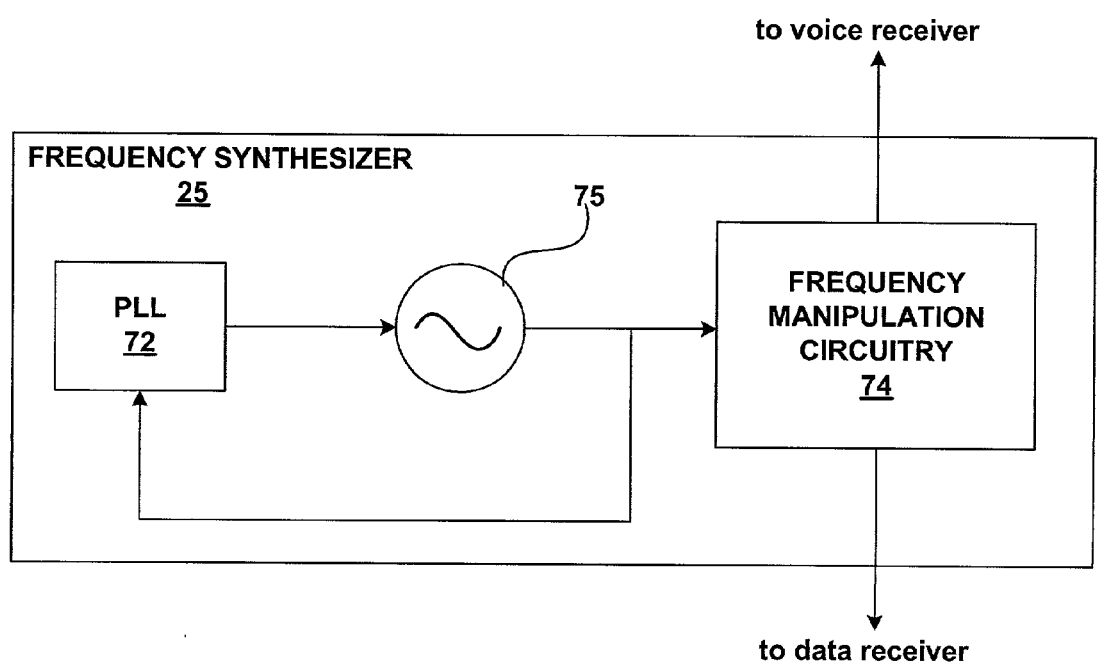
FIG. 7 is a more detailed block diagram of a frequency synthesizer.

FIG. 7 is a more detailed block diagram of a frequency synthesizer 25. Frequency synthesizer 25 may correspond to any of frequency synthesizers 25A, 25B or 25C discussed above. In this example, however, frequency synthesizer 25 will be described in the context of an implementation with voice and data receivers as illustrated in FIG. 3 and FIG. 6.

Frequency synthesizer 25 includes an oscillator 75, such as a voltage controlled oscillator (VCO). Phase locked loop (PLL) 72 applies an input voltage signal to oscillator 75 in order to control the frequency of oscillator 75. For example, PLL 72 may measure the output of oscillator 75, possibly implementing frequency dividers in order to compare the output frequency to a lower-frequency high-accuracy reference frequency, such as provided by a temperature compensated crystal oscillator (TCXO). PLL 72 may measure a frequency difference between the reference frequency and the output of oscillator 75 to measure a frequency error, and can adjust the input voltage to oscillator 75 accordingly. The input voltage provided to oscillator 75 by PLL 72 can be selected in order to tune oscillator 75 to a desired output frequency. As desired, one or more loop filters (not shown) may also be implemented.

Frequency synthesizer 25 also includes frequency manipulation circuitry 74 in order to generate different waveforms from the signal provided by oscillator 75. In particular, the use of frequency manipulation circuitry 74 may reduce the required tunable range of oscillator 75, thereby simplifying the implementation and possibly reducing implementation cost. For example, frequency manipulation circuitry 74 may include one or more dividers and one or more multipliers. In this manner, frequency synthesizer 25 can generate a first waveform at a frequency associated with voice communication standards, and a second waveform at a frequency associated with wireless networking standards. As illustrated, frequency manipulation circuitry 74 can output the respective waveform to the proper receiver for use in the down-conversion process.

Figure 8A:
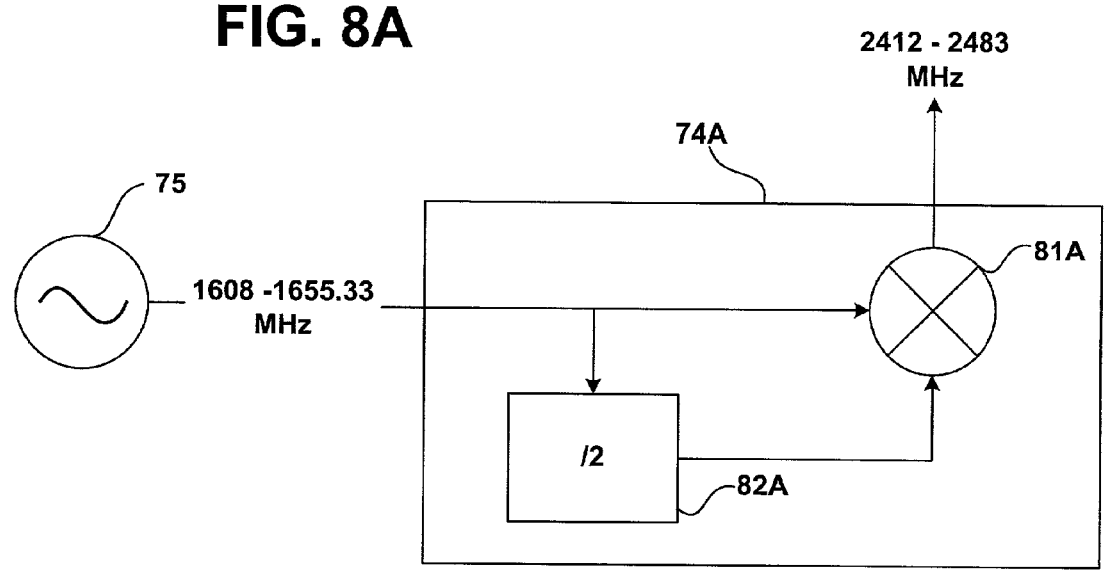
FIGS. 8A, 8B, 9 and 10 are more detailed block diagrams of exemplary frequency manipulation circuitry within a frequency synthesizer.

FIGS. 8A, 8B, 9 and 10 are more detailed block diagrams of exemplary frequency manipulation circuitry within a frequency synthesizer. In FIG. 8A, oscillator 75 is tuned to a 1600 MHz frequency band, i.e., at a frequency between approximately 1608 and 1655.33 MHz (also referred to as a 1600 MHz signal) to provide a signal to frequency manipulation circuitry. Frequency manipulation circuitry 74 implements a divider 82A to divide the 1600 MHz signal by two (2) in order to generate a signal that at a frequency between 804 and 827.67 MHz.

Divider 82A may be viewed as operating in a time domain. For example, divider 82A may include counters that count the leading or trailing edges of oscillator pulses, and provide a pulse signal each time an integer number of pulses is detected. In the illustrated example of FIG. 8, the integer of divider 82A is programmed at two (2). A signal oscillating in a 1600 MHz band (1608–1655.33) can be fed to divider 82A in order to generate a signal oscillating between 804 and 827.67 MHz.

The output of divider 82A can be provided to multiplier 81A. In particular, multiplier 81A receives a signal from divider 82A ranging between 804 and 827.67 MHz, and multiples the divided signal with the oscillating signal generated by oscillator 75 that is oscillating in the 1600 MHz band. The result of the multiplication is an upper band signal that is in a 2.4 GHz band, i.e., at a frequency between 2412 and 2483 MHz (also referred to as a 2.4 GHz signal) and a lower band signal that is between 804 and 827.67 MHz. Multiplier 81B, however, can be programmed to output only the upper band signal. This 2.4 GHz signal can be provided as a waveform to a mixer within a data receiver for use in down-converting RF signals modulated according to a wireless networking standard that operates in the 2.4 GHz band. Alternatively, the 2.4 GHz signal can be provided as a waveform to a mixer within a data transmitter for use in up-converting baseband signals onto a 2.4 GHz carrier.

Figure 8B:
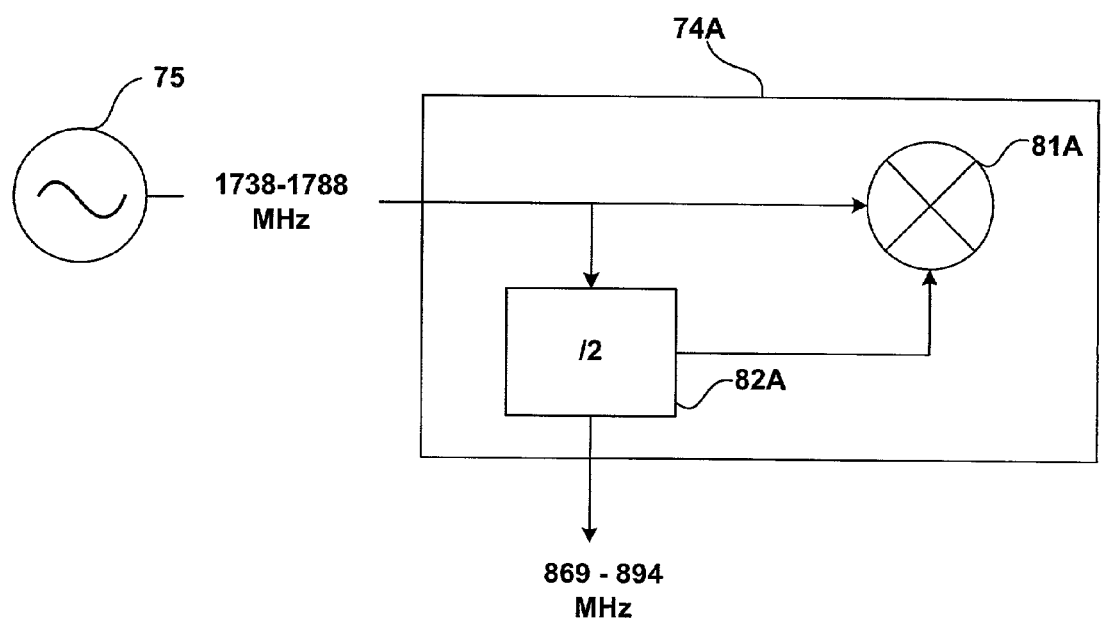

FIG. 8B illustrates how the same circuitry can illustrated in FIG. 8A may be used to generate a signal that oscillates between 869 and 894 MHz (referred to herein as an 800 MHz signal). Such an 800 MHz signal may be used for voice systems such as GSM. In order to generate the signal that oscillates between 869 and 894 MHz, oscillator 75 may be tuned to a 1738–1788 MHz band. The output of oscillator 75 can be fed to divider 82A in order to generate a signal oscillating between 869 and 894 MHz. This 800 MHz signal can be provided as a waveform to a mixer within a GSM voice receiver for use in down-converting RF signals modulated according to a GSM standard that operates in the 800 MHz band. Alternatively, the 800 MHz signal can be provided as a waveform to a mixer within a GSM transmitter for use in up-converting baseband signals onto a 800 MHz carrier. Because dividers and multipliers are implemented, the required tuning range of oscillator 75 can be reduced when both data and voice signals are mixed using the same frequency synthesizer. The desired signal can be generated by tuning oscillator 75 and selecting the division factor of divider 82A.

By implementing frequency manipulation circuitry 74, the tuning range of oscillator 75 may only need to be somewhere between approximately 1600 MHz and 1900 MHz in order to support the generation of waveforms for the data receiver in a 2.4 GHz band and waveforms for a voice receiver in an 800 MHz band, an 1800 MHz band or a 1900 MHz band. A tunable range falling somewhere between 1600 MHz and 1900 MHz can be implemented at very reasonable cost. The range may be smaller, as long as if falls somewhere between 1600 MHz and 1900 MHz. Tunable ranges larger than this may be cost prohibitive from an implementation standpoint.

Figure 9:
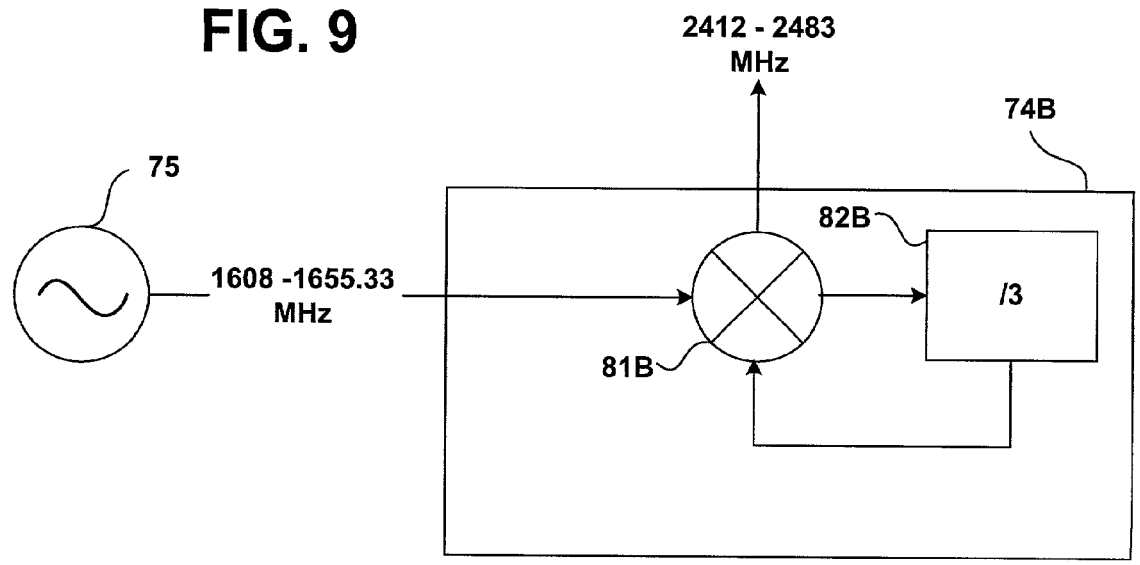

The examples of FIGS. 8A and 8B implement a feedforward loop in which the output of divider 82A is fed forward and combined with the oscillating signal generated by oscillator 75. FIG. 9 illustrates another way to generate different waveforms for use by different receivers or transmitters according to voice and data standards.

In the example of FIG. 9, frequency manipulation circuitry 74B implements a feedback loop. In that case, oscillator 75 provides a signal to frequency manipulation circuitry 74B in a 1600 MHz frequency band. Frequency manipulation circuitry 74 implements a multiplier 81B. For example multiplier 81B multiples the 1600 MHz signal provided by oscillator 75 with a divided signal in order to generate a signal in a 2.4 GHz band. Again, multiplier 81B may actually generate upper and lower band signals, but can be programmed to only output the upper band signal that is in the 2.4 GHz band. The 2.4 GHz signal can be provided as a waveform to a mixer on a data receiver or transmitter for use in a down-conversion or up-conversion process. In addition, the 2.4 GHz signal may be provided to divider 82B. Divider 82B divides the 2.4 GHz signal by three (3) in order to generate an signal in an 804 and 827.67 MHz, which is fed back to multiplier 81B.

In another example, the oscillator 75 may be tuned so that the divided signal oscillates in a 869–894 MHz band so that it can be provided as a waveform to a mixer on a GSM receiver or transmitter for use in a down-conversion or up-conversion process according to a voice communication standard that operates in the 800 MHz band. Again, by implementing dividers and multipliers, a single voltage controlled oscillator 75 can be used to generate waveforms at a variety of different frequencies. Moreover, dividers and multipliers allow the required tuning range of oscillator 75 to be reduced, which can in turn reduce implementation costs. By tuning the voltage controlled oscillator 75 and selecting the appropriate division factor of the divider 82, signals that oscillate at various different frequencies can be created.

For example, to generate an 1800 MHz signal, oscillator 75 can be tuned to the 1600 MHz band, and a frequency divider may be configured with a frequency division factor of 8, i.e., to generate a 200 MHz signal. The 200 MHz signal may then be multiplied with the 1600 MHz signal to obtain the 1800 MHz signal.

Figure 10:
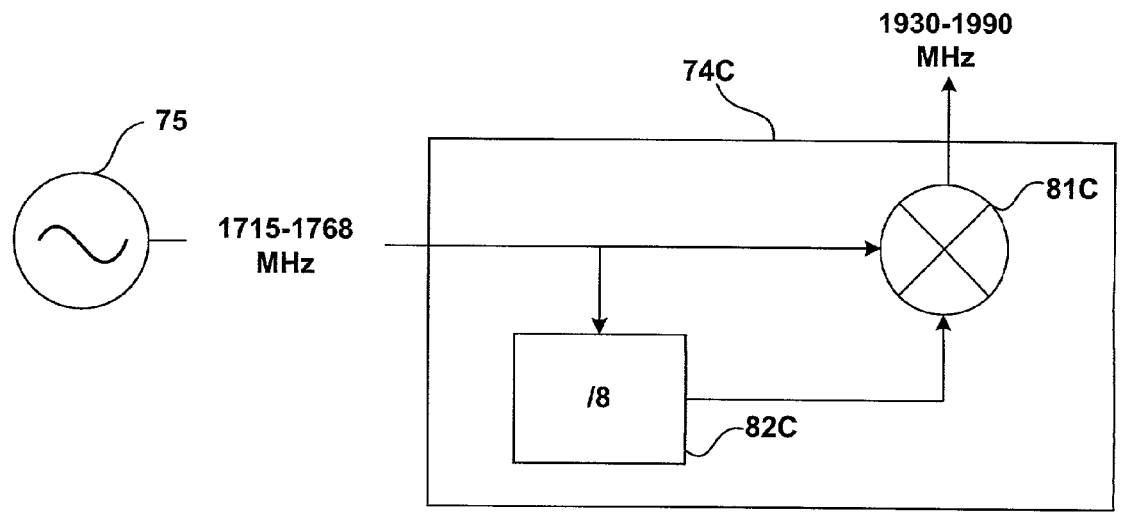

FIG. 10 illustrates an example in which a 1900 MHz signal, i.e., a waveform oscillating between 1930 and 1990 MHz is generated for use by a PCS voice receiver or transmitter. In that case, oscillator 75 can be tuned to a 1715–1768 MHz band. The 1715–1768 MHz signal can be divided by eight (8) by divider 82C and then multiplied by the 1715–1768 MHz signal using multiplier 81C in order to generate the signal that oscillates in the 1900 MHZ band.

The division factors of dividers 82, as well as the initial frequency of the voltage controlled oscillator 75 may be selected in order to define frequencies that correspond to the desired frequencies for voice and data communication. The division factors of dividers 82 may be programmable, providing flexibility in terms of the generation of various different frequency waveforms. Thus, the circuitry of FIG. 10 may be the same circuitry as FIG. 8A, where the programmable division factor of divider 82 changed from two (2) (divider 82A, FIG. 8A) to eight (8) (divider 82C, FIG. 10). In that case, the divider 82 may receive programmable inputs which define the dividing factors at which the divider operates. In some cases, a number of multipliers or a number of dividers can be implemented in order to generate waveforms at whatever frequency is desired. In this manner, both wireless communication standards and wireless networking standards can be supported using a single frequency synthesizer having a single voltage controlled oscillator. Such a configuration may reduce complexity of WCD 10 and may also conserve power since additional oscillators are avoided. In addition, device real estate requirements and manufacturing costs may also be reduced relative to some conventional WCDs. By tuning the oscillator 75, and selecting the appropriate division factor, the desired waveform can be generated using the same frequency synthesizer. Moreover, the implementation of dividers and multipliers may reduce the required tuning range of oscillator 75 which can simplify the implementation and reduce implementation costs.

Figure 11:
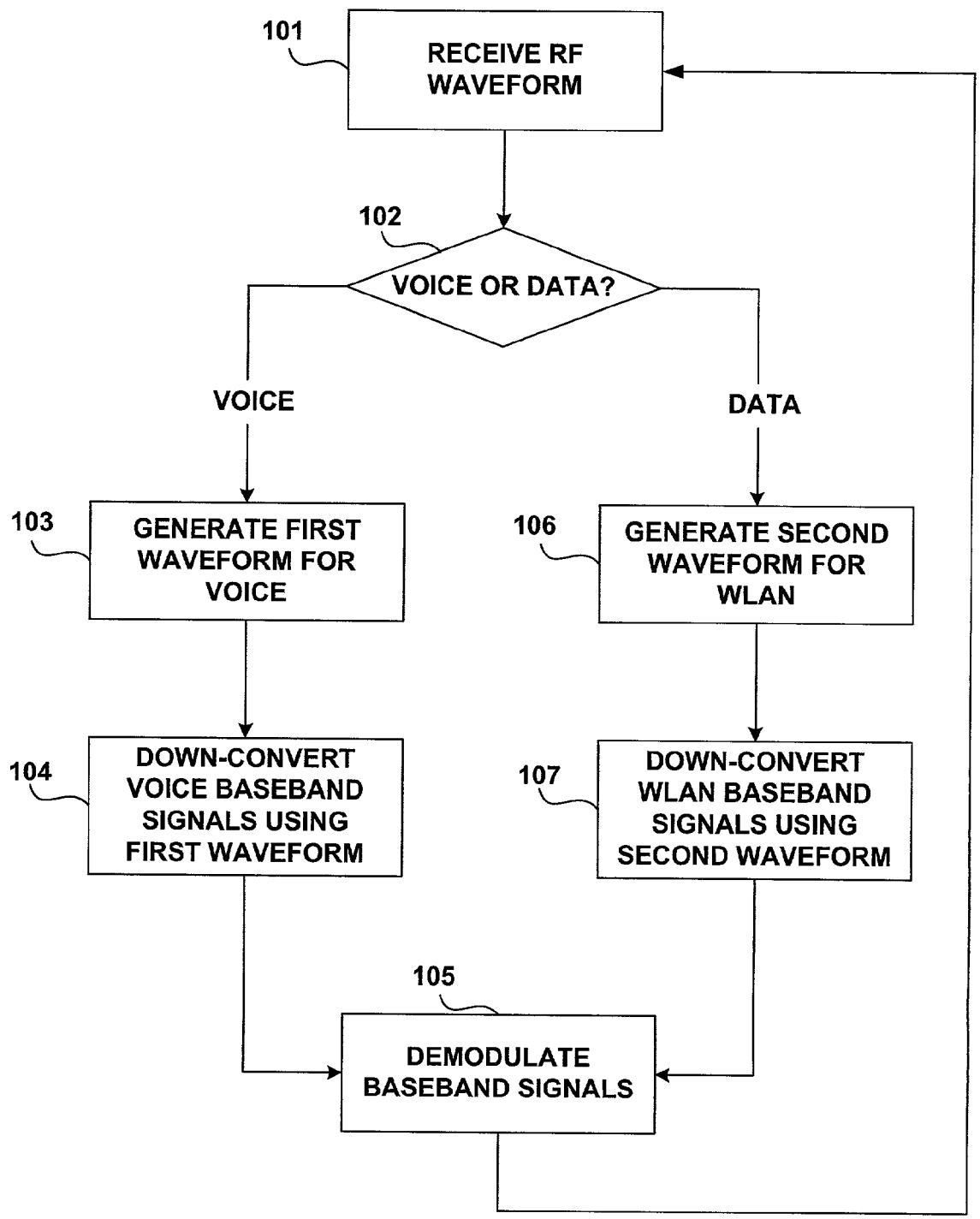
FIGS. 11 and 12 are flow diagrams illustrating techniques that can be implemented in a wireless communication device.

FIG. 11 is a flow diagram illustrating a technique that can be implemented in a wireless communication device during reception of RF signals that correspond to either signals of a voice communication standard or signals of a wireless networking standard. As shown, WCD 10 receives an RF waveform (101) and determines whether the received waveform corresponds to a data signal or a voice signal (102). For example, the modulation frequency of the received RF signal may be measured in order to differentiate the different signals. If the received RF waveform corresponds to a voice signal modulated according to a voice communication standard, frequency synthesizer 25 within WCD 10 generates a first waveform (103). For example, frequency synthesizer 25 may implement a voltage controlled oscillator 75 and frequency manipulation circuitry 74 in order to generate the first waveform at a frequency required for down-conversion of voice signals. WCD 10 uses the first waveform to down convert voice baseband signals from the received RF waveform (104). WCD 10 then demodulates the baseband signals (105).

If the received RF waveform corresponds to a data signal modulated according to a wireless networking standard, the same frequency synthesizer 25 within WCD 10 generates a second waveform (106). In that case, frequency synthesizer 25 tunes oscillator 75 and selects the appropriate division factor. The frequency manipulation circuitry 74 the manipulates a properly tuned signal from voltage controlled oscillator 75 in order to generate the second waveform at a frequency required for down-conversion of data signals. WCD 10 uses the second waveform to down convert data baseband signals from the received RF waveform (107). WCD 10 then demodulates the baseband signals (105).

Figure 12:
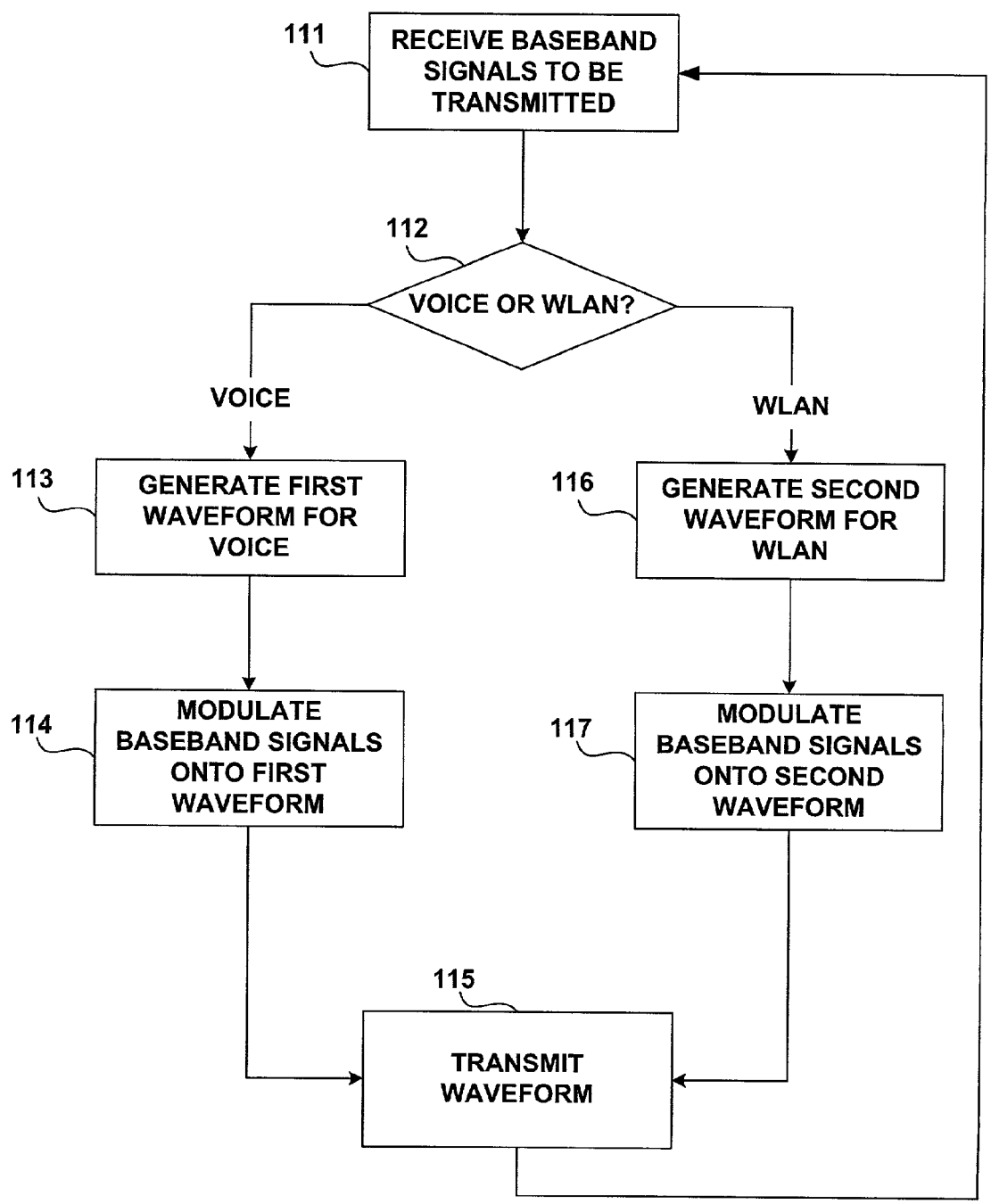

FIG. 12 is a flow diagram illustrating a technique analogous to that of FIG. 11. The technique of FIG. 12 can be implemented in a wireless communication device during transmission of RF signals that correspond to either signals of a voice communication standard or signals of a wireless networking standard. As shown, a transmitter of WCD 10 receives baseband signals from modem 26 (111). For example, different transmitters 32, 34 (FIG. 4) may receive the baseband signals from modem 26 depending on whether the baseband signals correspond to a voice communication standard or a wireless networking standard (112). If the baseband signal corresponds to a voice communication standard, frequency synthesizer 25 within WCD 10 generates a first carrier waveform having a frequency associated with the voice communication standard (113). WCD 10 up-converts voice baseband signals onto the first carrier waveform (114) and transmits the modulated carrier, e.g., to a base station 4.

If the baseband signal corresponds to a wireless networking standard, frequency synthesizer 25 within WCD 10 generates a second carrier waveform having a frequency associated with the wireless networking standard (116). In that case, WCD 10 up-converts voice baseband signals onto the second carrier waveform (117) and transmits the modulated carrier, e.g., to an access point 11.

WCD 10 may be improved and possibly simplified by using the same frequency synthesizer to generate first waveforms for use in transmission or reception of RF signals according to a voice communication standard, and second waveforms for use in transmission or reception of RF signals according to a wireless networking standard. WCD 10 may also conserve power since additional oscillators are avoided. In addition, device real estate requirements and manufacturing costs may be reduced relative to some conventional WCDs.

Figure 13:
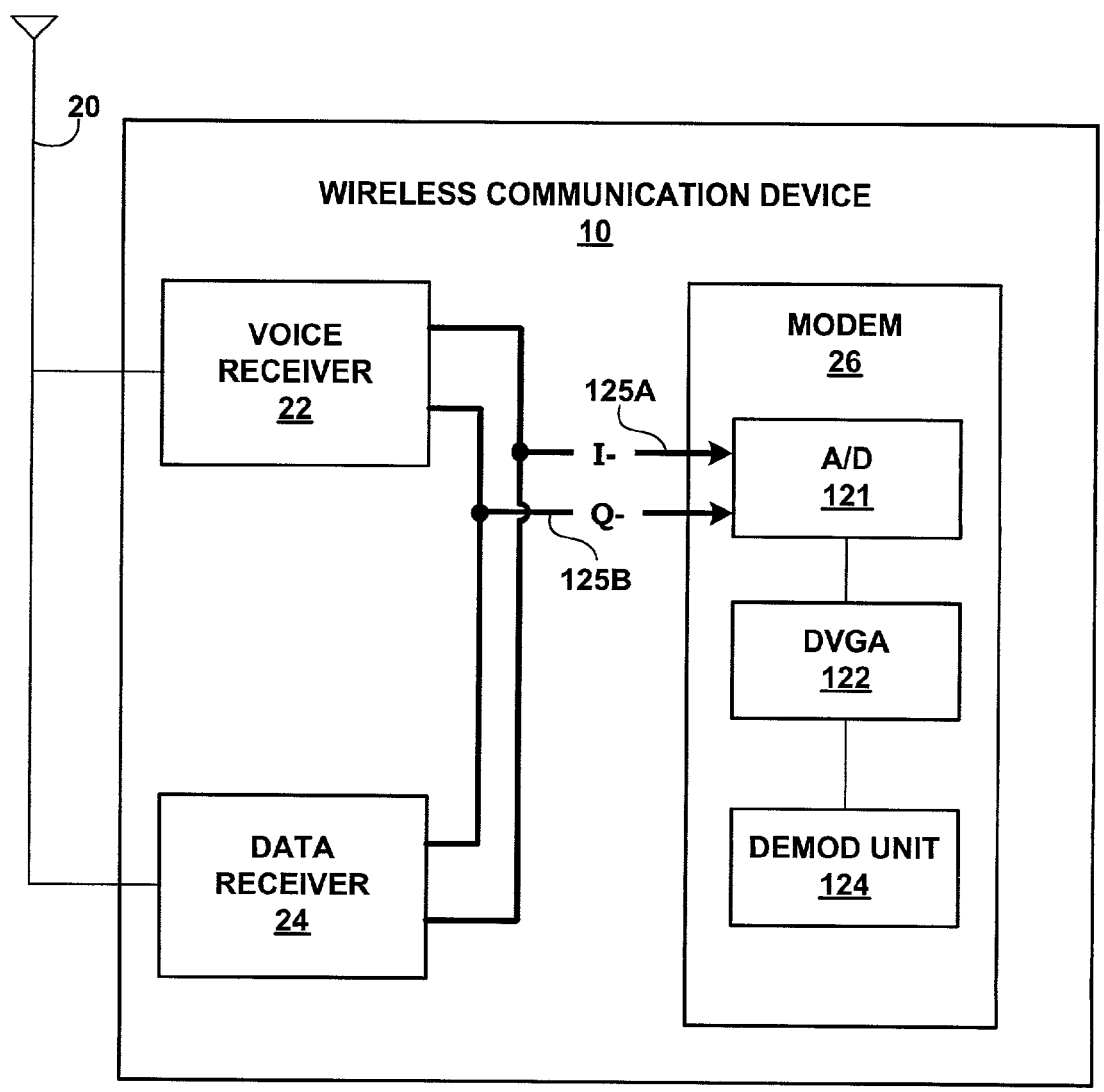
FIG. 13 is a block diagram of WCD according to an added embodiment in which a voice receiver and a data receiver transmit analog signals to a modem using the same analog transmission lines.

FIG. 13 is a block diagram of WCD 10 according to an added embodiment in which a voice receiver and a data receiver transmit analog signals to a modem using the same analog transmission lines. In particular, as illustrated in FIG. 13, receivers 22, 24 of WCD 10 may transmit I- and Q-baseband signals to modem 26. The I- component refers to the in-phase component of a complex waveform, whereas the Q- component refers to the quadrature-phase component of the complex waveform. Upon receiving the I- and Q-baseband signals, modem 26 converts the baseband signals to digital samples using analog-to-digital converter 121, scales the baseband signals using digital voltage gain amplifier (DVGA) 122, and demodulates the baseband signals using demodulation unit 124.

Modem 26 can be configured to demodulate baseband signals associated with voice communication standards or wireless networking standards. Voice receiver 22 and data receiver 24 may be coupled to modem 26 via a set of analog transmission lines 125A and 125B that are shared by the respective receivers 22, 24. In other words, baseband signals can be sent from voice receiver 22 to analog-to-digital converter 121 via analog transmission lines 125A and 125B, and different baseband signals can be sent from data receiver 24 to analog-to-digital converter 121 via the same analog transmission lines 125A and 125B. In this manner, the architecture of WCD 10 can be simplified when wireless voice communication standards and wireless networking standards are supported.

A number of techniques and embodiments of wireless communication devices have been described. For example, techniques for simplifying the architecture of a WCD have been described for use when the WCD supports both voice communication standards and wireless networking standards. Nevertheless, various other modifications may be made without departing from the spirit and scope of the invention. Accordingly, these and other embodiments are within the scope of the following claims.

The invention claimed is:

1. A method comprising:

generating a first waveform in a wireless communication device using a frequency synthesizer, wherein the first waveform has a frequency associated with a voice communication standard; and generating a second waveform in the wireless communication device using the frequency synthesizer, wherein the second waveform has a frequency associated with a wireless networking standard, wherein generating the first waveform comprises tuning an oscillator to generate a first signal having a first frequency, selecting a first division factor, and dividing the first signal by the first division factor, and wherein generating the second waveform comprises tuning the oscillator to generate a second signal having a second frequency, selecting a second division factor, dividing the second signal by the second division factor to generate a third signal, and multiplying the second signal and the third signal.

2. The method of claim 1, wherein the second waveform has a frequency in a 2.4 GHz band for an IEEE 802.11 standard.

3. The method of claim 1, wherein the first waveform has a frequency in an band selected from the following group for use with a voice communication standard: an 800 MHz band, an 1800 MHz band, and a 1900 MHz band.

4. A method comprising:

generating a first waveform in a wireless communication device using a frequency synthesizer, wherein the first waveform has a frequency associated with a voice communication standard; and generating a second waveform in the wireless communication device using the frequency synthesizer, wherein the second waveform has a frequency associated with a wireless networking standard, wherein generating the first waveform comprises tuning an oscillator to generate a first signal having a first frequency, selecting a division factor, multiplying the first signal by a second signal to generate a third signal, and dividing the third signal by the division factor, wherein the second signal is generated by dividing the third signal by the division factor.

5. The method of claim 4, wherein generating the second waveform comprises tuning an oscillator to generate a first signal having a first frequency, selecting a division factor, and multiplying the first signal by a second signal, wherein the second signal is generated by dividing a signal corresponding to the second waveform by the division factor.

6. The method of claim 4, wherein the first and second waveforms comprise reference waveforms, the method further comprising modulating the reference waveforms with baseband signals.

7. The method of claim 6 the method further comprising using the reference waveforms to produce baseband signals from received RF signals in a down-conversion process.

8. A wireless communication device comprising:

a first receiver that receives RF signals modulated according to a voice communication standard;

a second receiver that receives RF signals modulated according to a wireless networking standard; and a frequency synthesizer coupled to the first and second receivers that generates a first waveform at a first frequency associated with the voice communication standard and generates a second waveform at a second frequency associated with the wireless networking standard, wherein the frequency synthesizer includes a programmable divider and a multiplier, and wherein the frequency synthesizer generates the first waveform by tuning the oscillator to generate a first signal having a first frequency, selecting a first division factor, and dividing the first signal by the first division factor, and wherein generating the second waveform comprises tuning the oscillator to generate a second signal having a second frequency, selecting a second division factor, dividing the second signal by the second division factor to generate a third signal, and multiplying the second signal and the third signal.

9. The wireless communication device of claim 8, wherein the frequency synthesizer includes a voltage controlled oscillator having a tunable range that falls between approximately 1600 and 1900 MHz.

10. The wireless communication device of claim 8, wherein the first receiver and the second receiver are separate integrated circuits.

11. The wireless communication device of claim 8, wherein the first receiver and the second receiver are integrated as a single receiver.

12. The wireless communication device of claim 11, wherein the frequency synthesizer is integrated as part of the single receiver.

13. A wireless communication device comprising:

a first receiver that receives RF signals modulated according to a voice communication standard;

a second receiver that receives RF signals modulated according to a wireless networking standard; and a frequency synthesizer coupled to the first and second receivers that generates a first waveform at a first frequency associated with the voice communication standard and generates a second waveform at a second frequency associated with the wireless networking standard, wherein the frequency synthesizer generates the first waveform by tuning the oscillator to generate a first signal having a first frequency, selecting a division factor, multiplying the first signal by a second signal to generate a third signal, and dividing the third signal by the division factor, wherein the second signal is generated by dividing the third signal by the division factor.

14. The wireless communication device of claim 13, wherein the frequency synthesizer generates the second waveform by tuning the oscillator to generate a first signal having a first frequency, selecting a division factor, and multiplying the first signal by a second signal, wherein the second signal is generated by dividing a signal corresponding to the second waveform by the division factor.

15. A frequency synthesizer comprising:
a first circuitry that generates a first waveform at a first frequency associated with a voice communication standard;
a second circuitry that generates a second waveform at a second frequency associated with a wireless networking standard; and
a voltage controlled oscillator coupled to the first and second circuitry,
wherein the frequency synthesizer generates the first waveform by tuning the oscillator to generate a first signal having a first frequency, selecting a first division factor, and dividing the first signal by the first division factor, and wherein generating the second waveform comprises tuning the oscillator to generate a second signal having a second frequency, selecting a second division factor, dividing the second signal by the second division factor to generate a third signal, and multiplying the second signal and the third signal.

16. The frequency synthesizer of claim 15, wherein a tunable range of the voltage controlled oscillator falls between approximately 1600 and 1900MHz.

17. The frequency synthesizer of claim 16, wherein the frequency synthesizer includes a programmable divider and a multiplier.

18. The frequency synthesizer of claim 15, wherein the frequency associated with the wireless networking standard is in a 2.4 GHz band.

19. A frequency synthesizer comprising:
a first circuitry that generates a first waveform at a first frequency associated with a voice communication standard;
a second circuitry that generates a second waveform at a second frequency associated with a wireless networking standard; and
a voltage controlled oscillator coupled to the first and second circuitry, wherein the frequency synthesizer generates the first waveform by tuning the oscillator to generate a first signal having a first frequency, selecting a division factor, multiplying the first signal by a second signal to generate a third signal, and dividing the third signal by the division factor, wherein the second signal is generated by dividing the third signal by the division factor.

20. The frequency synthesizer of claim 19, wherein the frequency synthesizer generates the second waveform by tuning the oscillator to generate a first signal having a first frequency, selecting a division factor, and multiplying the first signal by a second signal, wherein the second signal is generated by dividing a signal corresponding to the second waveform by the division factor.

21. A wireless communication device comprising:
means for generating a first waveform using a frequency synthesizer, wherein the first waveform has a frequency associated with a voice communication standard; and
means generating a second waveform using the frequency synthesizer, wherein the second waveform has a frequency associated with a wireless networking standard,
wherein generating the first waveform comprises tuning an oscillator to generate a first signal having a first frequency, selecting a first division factor, and dividing the first signal by the first division factor, and wherein generating the second waveform comprises tuning the oscillator to generate a second signal having a second frequency, selecting a second division factor, dividing the second signal by the second division factor to generate a third signal, and multiplying the second signal and the third signal.

22. The wireless communication device of claim 21, wherein the means for generating the first waveform and means for generating the second waveform include means for multiplying and means for dividing.

23. A method comprising:
generating first in-phase and quadrature-phase baseband signals from an RF waveform modulated according to a wireless networking standard;
transmitting the first in-phase and quadrature-phase baseband signals from a receiver associated with wireless networking to a modem over analog transmission lines;
generating second in-phase and quadrature-phase baseband signals from an RF waveform modulated according to a voice communication standard; and
transmitting the second in-phase and quadrature-phase baseband signals from a receiver associated with voice communication to the modem over the analog transmission lines.

24. The method of claim 23, further comprising demodulating the first in-phase and quadrature-phase baseband signals and demodulating the second in-phase and quadrature-phase baseband signals.

25. A wireless communication device comprising:
a first receiver that receives RF signals modulated according to a voice communication standard and generates first in-phase and quadrature-phase baseband signals;
a second receiver that receives RF signals modulated according to a wireless networking standard and generates second in-phase and quadrature-phase baseband signals;
a modem coupled to the first and second receivers, wherein the modem receives first in-phase and quadrature-phase baseband signals from the first receiver via a set of analog transmission lines, and receives second in-phase and quadrature-phase baseband signals from the second receiver via the set of analog transmission lines.

26. The wireless communication device of claim 25, wherein the modem includes an analog-to-digital converter, wherein the transmission lines couple the analog-to-digital converter to both the first and second receivers.

* * * * *